(12) United States Patent
Gehrke

(10) Patent No.: US 9,711,436 B2
(45) Date of Patent: Jul. 18, 2017

(54) MULTI CHIP MODULE, METHOD FOR OPERATING THE SAME AND DC/DC CONVERTER

(75) Inventor: Dirk Gehrke, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 1157 days.

(21) Appl. No.: 13/351,072

(22) Filed: Jan. 16, 2012

(65) Prior Publication Data

US 2012/0181996 A1    Jul. 19, 2012

(30) Foreign Application Priority Data

Jan. 19, 2011   (DE) .................. 10 2011 008 952

(51) Int. Cl.
*H01L 23/495* (2006.01)
*H01L 23/31* (2006.01)
(Continued)

(52) U.S. Cl.
CPC ...... *H01L 23/49575* (2013.01); *H01L 23/495* (2013.01); *H01L 23/49524* (2013.01); *H01L 23/49562* (2013.01); *H01L 24/40* (2013.01); *H01L 24/49* (2013.01); *H01L 23/3107* (2013.01); *H01L 24/37* (2013.01); *H01L 24/48* (2013.01); *H01L 2224/05554* (2013.01); *H01L 2224/37147* (2013.01); *H01L 2224/40247* (2013.01); *H01L 2224/48137* (2013.01); *H01L 2224/48247* (2013.01); *H01L 2224/4903* (2013.01); *H01L 2224/49113* (2013.01); *H01L 2224/73221* (2013.01);

(Continued)

(58) Field of Classification Search
CPC ........... H01L 23/3114; H01L 23/49816; H01L 23/49503; H01L 25/043; H01L 25/0657
USPC .... 323/280; 257/676, 777, E23.04, E23.037, 257/E21.002
See application file for complete search history.

(56) References Cited

U.S. PATENT DOCUMENTS 3,451,808 A * 6/1969 Thielmann ................ C22C 5/06
338/334
2005/0173807 A1* 8/2005 Zhu et al. ..................... 257/777
(Continued)

FOREIGN PATENT DOCUMENTS

DE  102005039478  2/2007
JP  2006140217    1/2006
WO  WO2005011342  2/2005

OTHER PUBLICATIONS

DE Search Report mailed Mar. 2012.
(Continued)

*Primary Examiner* — Harry Behm
*Assistant Examiner* — Bryan R Perez
(74) *Attorney, Agent, or Firm* — Lawrence J. Bassuk; Charles A. Brill; Frank D. Cimino

(57) ABSTRACT

A multi chip module having a current sensing circuit and a semiconductor half bridge configuration having two vertically stacked field effect transistor dies that are connected by horizontally extending tap clips at respective opposite sides of their channels, wherein the current sensing circuit is coupled to two checkpoints, at least one being located on one of the tap clips so as to measure a voltage drop over a predetermined portion of the tap clip acting as a shunt resistor for sensing a current that is provided to a switching node of the half bridge configuration.

7 Claims, 7 Drawing Sheets

(51) Int. Cl.
*H01L 23/00* (2006.01)
*H02M 1/00* (2006.01)
*H02M 3/158* (2006.01)

(52) U.S. Cl.
CPC ............... *H01L 2924/00014* (2013.01); *H01L 2924/1306* (2013.01); *H01L 2924/181* (2013.01); *H01L 2924/30107* (2013.01); *H02M 3/1588* (2013.01); *H02M 2001/0009* (2013.01); *Y02B 70/1466* (2013.01)

(56) References Cited

U.S. PATENT DOCUMENTS

| | | | |
|---|---|---|---|
| 2006/0131760 A1* | 6/2006 | Standing | H01L 23/3107 257/787 |
| 2007/0262346 A1* | 11/2007 | Otremba | H01L 23/481 257/177 |
| 2008/0067659 A1* | 3/2008 | Kim et al. | 257/686 |
| 2008/0088300 A1* | 4/2008 | Koelle | G01R 1/203 324/156 |
| 2008/0158823 A1* | 7/2008 | Tominaga | B60R 16/0239 361/709 |
| 2009/0001952 A1* | 1/2009 | Chang | H02M 3/156 323/280 |
| 2009/0072415 A1* | 3/2009 | Mahler et al. | 257/784 |
| 2009/0251119 A1* | 10/2009 | Stojcic | H01L 23/49575 323/282 |
| 2011/0188218 A1* | 8/2011 | Hsing | H03K 17/687 361/772 |
| 2011/0227207 A1* | 9/2011 | Yilmaz | H01L 23/49537 257/676 |

OTHER PUBLICATIONS

English translation of JP2006140217.
CSD86350Q5D Data Sheet from Texas Instruments Incorporated (Rev. Oct. 2011).

* cited by examiner

MULTI CHIP MODULE, METHOD FOR OPERATING THE SAME AND DC/DC CONVERTER

CROSS-REFERENCE TO RELATED APPLICATIONS

This patent application claims priority from German Patent Application No. 10 2011 008 952.7, filed Jan. 19, 2011, which is incorporated herein by reference in its entirety.

FIELD OF THE INVENTION

The invention relates to a multi chip module comprising a current sensing circuit and a semiconductor half bridge configuration. Further, the invention relates to a method for operating the multi chip module. The invention further relates to a DC/DC converter comprising a controller for driving a semiconductor half bridge configuration, an inductance and a voltage sensing circuit.

BACKGROUND OF THE INVENTION

Today, customers of DC/DC converters have a need to do DCR current sensing on the inductor, making use of its copper resistance by adding a R-C network in parallel to the buck converter inductor to do voltage sensing across the inductor resistance or alternatively using a shunt to do the sensing. A shunt would be a resistor in the mOhm range, either in the output power rail or in the ground return path. This way, allowing measurement of the current delivered to the load. However, those implementations hurt the efficiency and are usually not as accurate as desired. Especially in mass production trimming and tolerances, as this means additional cost. Further, it is expected that in near future, the switching frequencies of the DC/DC converters will increase, which means that the inductance value of the inductor will become smaller, which in turn will result in a significantly lower on-resistance of the inductor. This will cause severe difficulties in reading out the current in the inductor by making use of the small DCR of its copper windings. Again, a shunt resistor may be applied for DCR current sensing, which will however cause an additional power loss. Further, an expensive and precise shunt sense resistor is needed. An opportunity could be to make use of a copper trace that is a part of a printed circuit board as a shunt resistor. However, this will require a very tight production control of the printed circuit boards in order to ensure that the resistance of this printed shunt resistor is well defined and always has the same value. This could be achieved by laser trimming the printed copper trace, but again, this would cause additional costs and would increase production complexity.

Customers designing DC/DC converters are further aiming for a high efficiency, a small form factor and a high integration of components. In principle, this is provided by multi chip modules (MCM). A further goal is to reduce the cost of the DC/DC converter while not sacrificing performance and efficiency.

SUMMARY OF THE INVENTION

It is a general object of the present invention to provide a multi chip module, a method for operating the same and a DC/DC converter that allows a cost effective and accurate current sensing at the switching node of a half bridge configuration that is a part of the multi chip module and the DC/DC converter, respectively.

In one aspect of the invention, a multi chip module comprising a current sensing circuit and a semiconductor half bridge configuration is provided. The semiconductor half bridge configuration comprises two vertically stacked field effect transistor dies that are connected by horizontally extending tap clips at respective opposite sides of their channels. In other words, the field effect transistors used for this setup are source down field effect transistors. The current sensing circuit of the multi chip module according to the invention is coupled to two checkpoints, wherein at least one of the two checkpoints is located on one of the tap clips of the vertically stacked field effect transistor configuration. The two checkpoints are arranged so as to measure a voltage drop over a predetermined portion of the respective tap clip that is acting as a shunt resistor for sensing a current that is provided to a switching node of the half bridge configuration.

According to another aspect of the invention, the shape of the tap clips may be modified in a way that small legs are added to allow Kelvin-sensing. The tap clips are mechanical parts and this slight modification will not affect the functionallity of the half bridge configuration. Further, the bonding to tap clip that is connected to the outside of the package could be either connected to the lead frame pin or the tap clip itself A further goal in the design of modern DC/DC converters is to make use of digital control or digital interfaces to digitally read out values such as voltage, current or temperature. The current sensing circuit could be configured so as to allow this digital readout of data. Another option is to program the current sensing circuit via a digital interface so as to set a voltage or a current limit.

The multi chip module makes use of the on-resistance of the tap clip of the vertically stacked field effect transistor configuration for determination of the current that is provided to the switching node via said tap clip. According to the invention, the multi chip module does not need an extra shunt resistor. It is a compact and highly integrated solution providing an opportunity for precise DCR current sensing at the switching node. Further, an embedded solution for DCR current sensing is provided. No additional losses occur and, at the same time, the accuracy of the DCR current sensing is improved. No additional board space is required especially if the current sensing circuit is integrated into a controller circuit that is controlling the semiconductor half bridge configuration.

According to another aspect of the invention, the multi chip module comprises a center tap clip that is coupled to a switching zone that is located between a drain zone of a low-side field effect transistor and a source zone of a high-side field effect transistor of the semiconductor half bridge configuration. The center tap clip provides an electrical connection to a switching node terminal of the half bridge configuration. At least one of the two checkpoints of the current sensing circuit is located on the center tap clip. Preferably, the switching node is coupled to an inductance of a DC/DC converter. The often desired DCR current sensing in the inductance of the converter may be performed by simply making use of the on-resistance of a part of the central tap clip that is used as a kind of shunt resistor.

According to another embodiment, the multi chip module comprises a center tap clip that is coupled to a switching zone that is located between a source zone of a low-side field effect transistor and a drain zone of a high-side field effect transistor of the semiconductor half bridge configuration so as to provide an electrical connection to a switching node terminal of the half bridge configuration and wherein at least one of the two checkpoints of the current sensing circuit is located on the center tap clip.

In another aspect of the invention, an upper tap clip is coupled to a gate zone of a high-side field effect transistor and/or a lower tap clip is coupled to a source zone of a low-side field effect transistor of the semiconductor half bridge configuration. At least one of the two checkpoints of the current sensing circuit is located on the upper or the lower tap clip. High-side and/or low-side FET current sensing may be performed.

The current sensing circuit is coupled to a switching signal channel of at least one of the field effect transistors so as to allow a triggering of the measurement of the current that is provided to the switching node. Irritations of the current sensing that are due to the switching transitions may be filtered out by suitably triggering the measurement. The low-side or high-side FET gate drive signals may be used as trigger signals.

According to another aspect of the invention, the predetermined distance between the two checkpoints, a thickness and/or a material of the tap clip comprising the at least one checkpoint, may be selected so as to provide a predetermined resistance of the shunt resistor. The tap clips of the stacked semiconductor configuration are a mechanical implementation and, accordingly, it is easily possible to modify i.e., a thickness of the tap, clip in order to modify its on resistance. This allows an easy adjustment of the on-resistance without causing excessive heat-up of the overall implementation.

The tap clips are made of copper which provides a high electrical and thermal conductance. Instead of staying with the copper clip implementation, according to another aspect of the invention, at least the tap clip comprising the at least one checkpoint may be made of a manganine alloy. Manganine is a commonly used name for an alloy of typically 86% copper, 12% manganese and 2% nickel. Manganine provides the advantage of virtually having a zero temperature coefficient of resistance. Further, it offers long-term stability. The use of manganine simplifies the current sensing circuit since the need of a temperature-dependent compensation is no longer present. According to another advantageous aspect of the invention, the lead frame of the multi chip module is also made of a manganine alloy. This allows performing a more accurate high-side FET or low-side FET current sensing in case this is desired.

In another aspect of the invention, the multi chip module has a layout wherein the current sensing circuit and the semiconductor half bridge configuration share a common lead frame and the current sensing circuit is positioned next to or on top of the semiconductor half bridge configuration. In the latter layout, the current sensing circuit is stacked on top of the drain clip of the high-side FET. This layout saves space and increases the power density. Further, the current sensing circuit may be integrated into a controller circuit for driving the semiconductor half bridge configuration.

According to another aspect of the invention, a DC/DC converter is provided. The DC/DC converter comprises a controller for driving a semiconductor half bridge configuration comprising a low-side and a high-side field effect transistor dies that are vertically stacked and that are further connected by horizontally extending tap clips at respective opposite sides of their channels. A center tap clip is coupled to a drain zone of the low-side field effect transistor and a source zone of the high-side field effect transistor so as to provide a connection to a switching node terminal.

The DC/DC converter further comprises an inductance that is coupled to the switching node terminal.

Finally, the DC/DC converter comprises a current sensing circuit that is coupled to two checkpoints wherein at least one of the two checkpoints is located on one of the tap clips so as to sense a voltage drop over a predetermined portion of the tap clip acting as a shunt resistor for sensing a current that is provided to the inductance.

The same or similar advantages already mentioned for the multi chip module apply to the DC/DC converter according to the invention. In particular, the DC/DC converter allows a cost effective, reliable and accurate measurement of the current provided to the inductance of the converter.

According to another aspect of the invention, a method for operating a multi chip module is provided. The multi chip module comprises of a current sensing circuit and a semiconductor half bridge configuration comprising two vertically stacked field effect transistor dies. The vertically stacked dies are connected by horizontally extending tap clips at respective opposite sides of their channels. The current sensing circuit is coupled to two checkpoints, wherein at least one of the two checkpoints is located on one of the tap clips. A voltage drop over a predetermined portion of the tap clip acting as a shunt resistor is measured and a current that is provided to a switching node of the half bridge configuration is determined based on the determined voltage drop.

The same or similar advantages already mentioned for the multi chip module according to the invention also apply to the method for operating the same.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENTS

Figure 1:
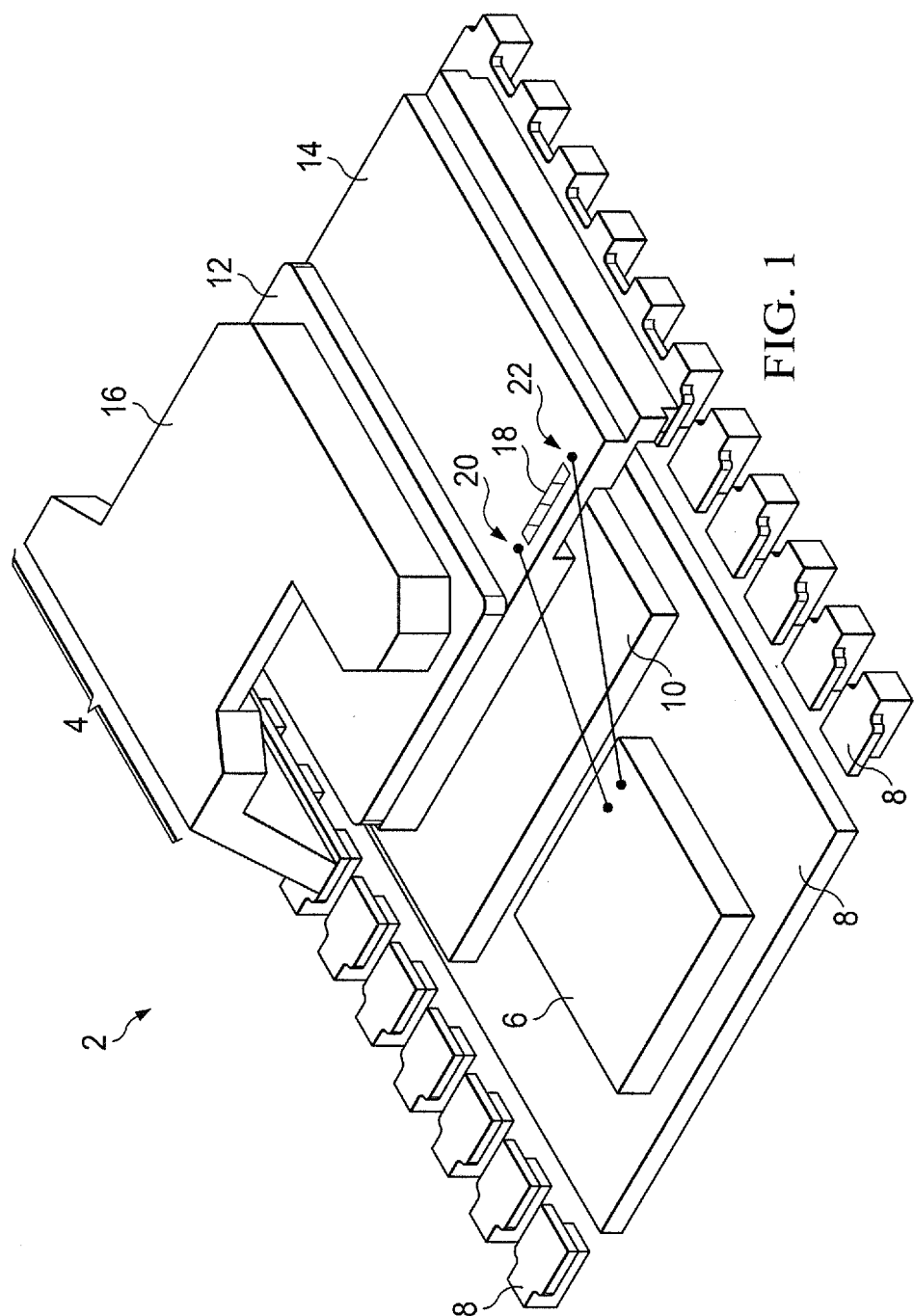
FIGS. 1 and 5 are simplified perspective views to a multi chip module according to embodiments of the invention.

FIG. 1 is a simplified perspective view of a multi chip module 2 comprising a vertically stacked semiconductor half bridge configuration 4 and a control unit 6 that are positioned on a common lead frame 8 beside each other. The vertically stacked semiconductor half bridge configuration 4 comprises a low-side field effect transistor die 10 and a high-side field effect transistor die 12. The source of the low-side field effect transistor die 10 is coupled to a bottom contact (not shown) of the multi chip module 2, while its drain is coupled to a central tap clip 14. The central tap clip 14 provides a switching node that is connected to an inductance of a DC/DC converter. The drain of the high-side field effect transistor die 12 is coupled to an upper tap clip 16. The tap clips, (e.g., the lower tap clip (not shown), the central tap clip 14 and the upper tap clip 16), can be made of copper. Alternatively, they can be made of a manganin alloy, which is an alloy of 86% copper, 12% manganese and 2% nickel. According to another embodiment, the lead frame 8 is also made of a manganin alloy. The control unit 6 comprises a pulse width modulator controller (also referred to as a PWM controller) providing a pulse width modulated signal to a respective driver of the high-side and low-side field effect transistor 12, 10, so as to provide a signal for the inductance of a DC/DC converter. To enhance clarity of FIG. 1, the respective wiring between the control unit 6 and the drivers that may further be a part of the control unit 6 and the respective high-side and low-side field effect transistor 12, 10 are not shown. The control unit 6 further comprises a current sensing circuitry (CSC) for sensing a voltage drop over a predetermined portion 18 of the central tap clip 14. According to the exemplary embodiment, a first checkpoint 20 and a second checkpoint 22 is located on the central tap clip 14. However, it is also possible to place the second checkpoint 22 to the lead frame or a contact thereof. By measuring a voltage drop over the predetermined portion 18, between the first and second checkpoint 20 and 22, a current that is provided to a switching node by the central tap clip 14 may be measured.

Figure 2:
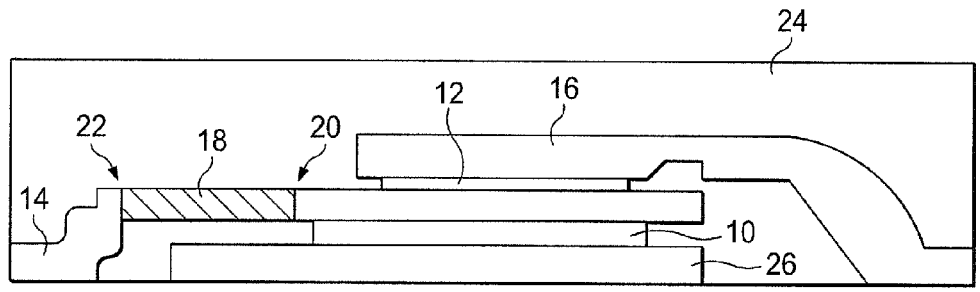
FIGS. 2 and 6 are schematic cross sectional views to the multi chip module according to FIGS. 1 and 5, respectively.

FIG. 2 is a schematic cross-sectional view of the multi chip module 2 of FIG. 1 at a plane crossing the semiconductor half bridge configuration 4. In FIG. 1, the usually applied molding material used for packing the multi chip module 2 is omitted for clarity reasons. In FIG. 2, the semiconductor half bridge configuration 4 is embedded in a molding material 24. A high-side field effect transistor die 12 is located between the upper tap clip 16 and the central tap clip 14. A low-side field effect transistor die 10 is placed between the central tap clip 14 and a bottom tap clip 26. The first and second checkpoint 20 and 22 are illustrated by respective arrows. The predetermined portion 18 extends between the two checkpoints 20 and 22 in the central tap clip 14.

Exemplarily, the vertically stacked half bridge configuration comprising the high-side and low-side field effect transistor dies 12, 10 is similar in construction to the so-called power block device (e.g., the power block CSD86350Q5D from Texas Instruments). Typically, a power block is a stacked source down NexFET™ configuration, wherein the central tap clip 16 that is typically used for contacting a switching node is coupled to the drain of the low-side field effect transistor die 10 and a source of the high-side field effect transistor die 12. An upper and lower tap clip 16, 26 is coupled to a respective opposite end of the channel of the high-side and low-side field effect transistor dies 12, 10 that is averted from the central tap clip 14.

Figure 3:
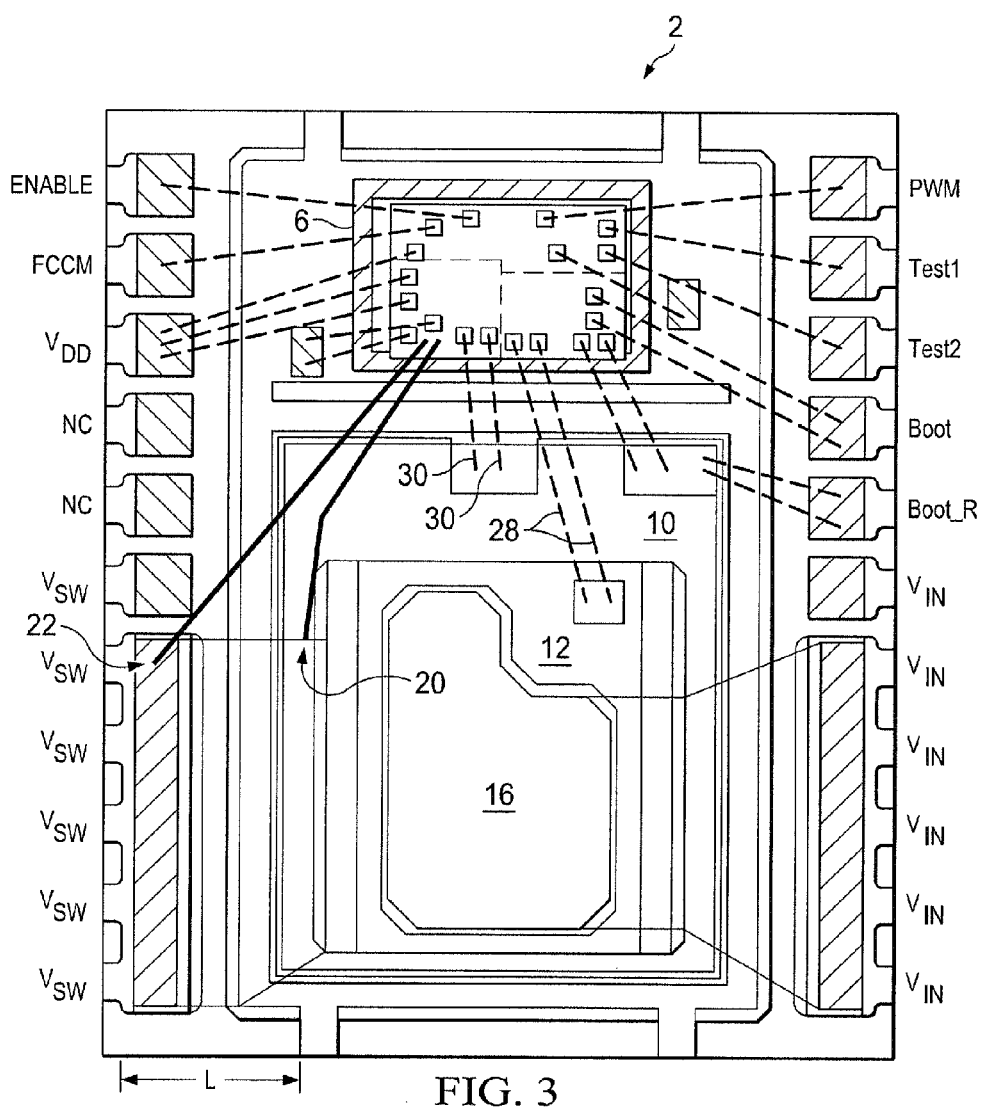
FIGS. 3 and 7 are simplified top views of the multi chip modules according embodiments of the invention.

FIG. 3 is a simplified top view of the multi chip module 2 known from FIG. 1. The control unit 6 provides a pulse-width-modulated signal via the connection 28 to the high-side field effect transistor die 16 and via the connection 30 to the low-side field effect transistor die 10. The current sensing circuitry (CSC) is coupled to the first and second checkpoints 20 and 22 that are positioned on the central tap clip 14. The multi chip module 2 receives a supply voltage $V_{DD}$ and provides a switch voltage $V_{SW}$ to i.e., an inductance of a DC/DC converter. The multi chip module 2 receives an input voltage via the terminal $V_{IN}$. Further terminals are ENABLE, TEST1, TEST2, BOOT, BOOT_R, FCCM, and NC. The length of the predetermined portion of the central tap clip 14 is L according to the embodiment depicted herein.

Figure 4:
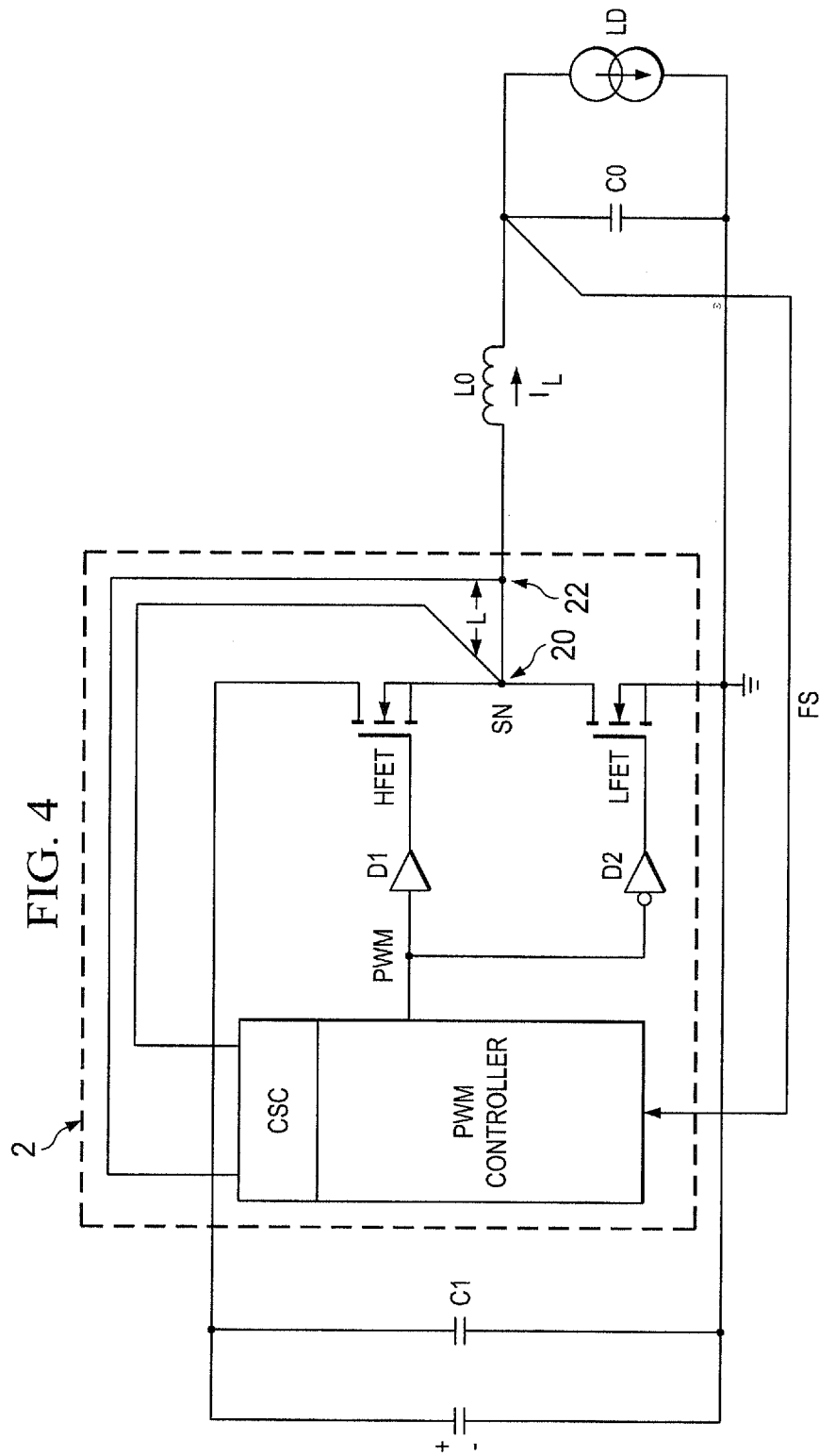
FIGS. 4 and 8 are a simplified circuit diagrams for DC/DC converters according to embodiments of the invention.

FIG. 4 is a simplified circuit diagram for a DC/DC converter comprising a multi chip module 2 according to an embodiment of the invention. The multi chip module 2 comprises a control unit 6 having a PWM controller providing a pulse-width-modulated signal PWM to a first and second driver D1, D2 driving the high-side field effect transistor (also referred to as a FET) HFET and low-side FET LFET. The source of the high-side FET HFET and the drain of the low-side FET LFET are coupled to a switching node SN that is exemplarily equal to the terminal $V_{SW}$ of the multi chip module 2 in FIG. 3. A first and second checkpoint 20 and 22 are exemplarily coupled to the switching node SN and the predetermined portion 18 used for measuring a voltage drop and is schematically depicted by the distance L between the two checkpoints 20 and 22. The current sensing circuit CSC calculates a current that is provided at the switching node SN from the voltage drop over the predetermined portion 18 having the length L.

Accordingly, a current that is provided to the inductance L0 that is a part of a DC/DC converter comprising L0 and the capacitance C0, namely the current $I_L$, may be determined. The DC/DC converter provides a converted current to a load LV. A feedback signal FS is connected between the inductance L0 and the capacitance C0 and is coupled to the PWM controller.

According to the aforementioned embodiment current sensing was performed at the switching node SN, however it is also possible to provide high-side current sensing by measuring a voltage drop over a predetermined portion of the upper tap clip 16. An exemplary embodiment for high-side current sensing is depicted in FIGS. 5 to 8, showing a perspective view of a multi chip module (FIG. 5), a cross-sectional view of the same (FIG. 6), a schematic top view of the same (FIG. 7) and the corresponding simplified circuit diagram (FIG. 8).

Figure 5:
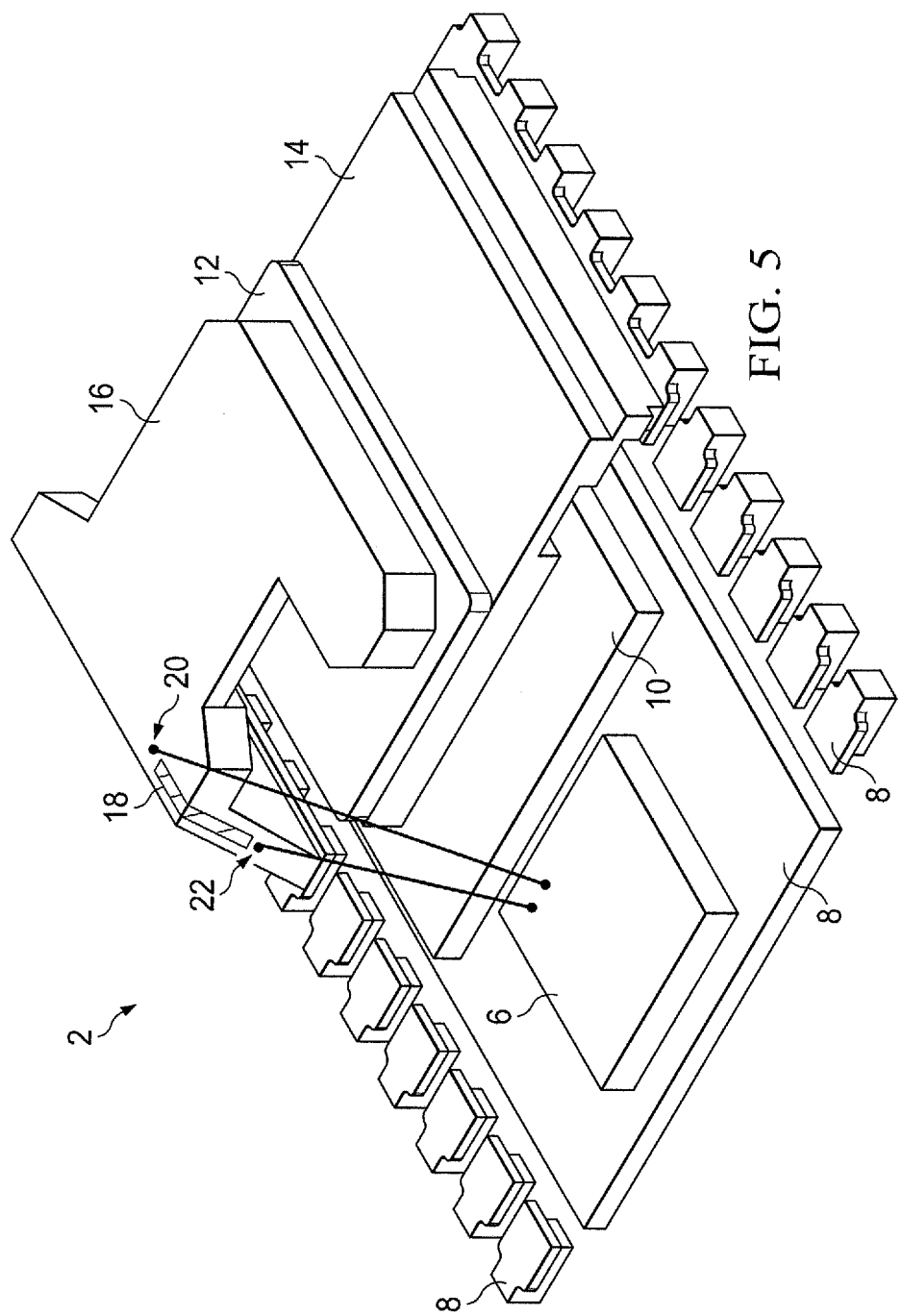

The perspective view in FIG. 5 corresponds to the perspective view in FIG. 1; however, the first and second checkpoint 20 and 22 are located on the upper tap clip 16 in order to allow high-side current sensing. Accordingly, the predetermined portion is a part of the upper tap clip 16. Further parts of the multi chip module 2 are already mentioned with conjunction to FIG. 1.

Figure 6:
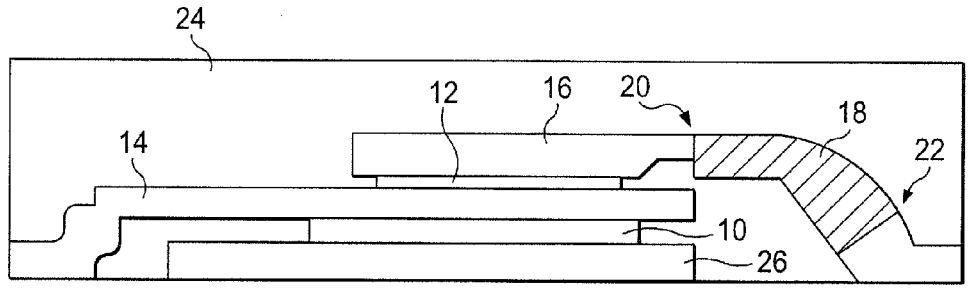

FIG. 6 is a schematic cross-sectional view of the multi chip module 2 of FIG. 5, wherein in contrast to FIG. 2, current sensing is performed at the high-side FET and the first and second checkpoint 20 and 22 are located on the high-side clip 16. Further parts of the cross-sectional view of FIG. 6 are already explained with reference to FIG. 2.

Figure 7:
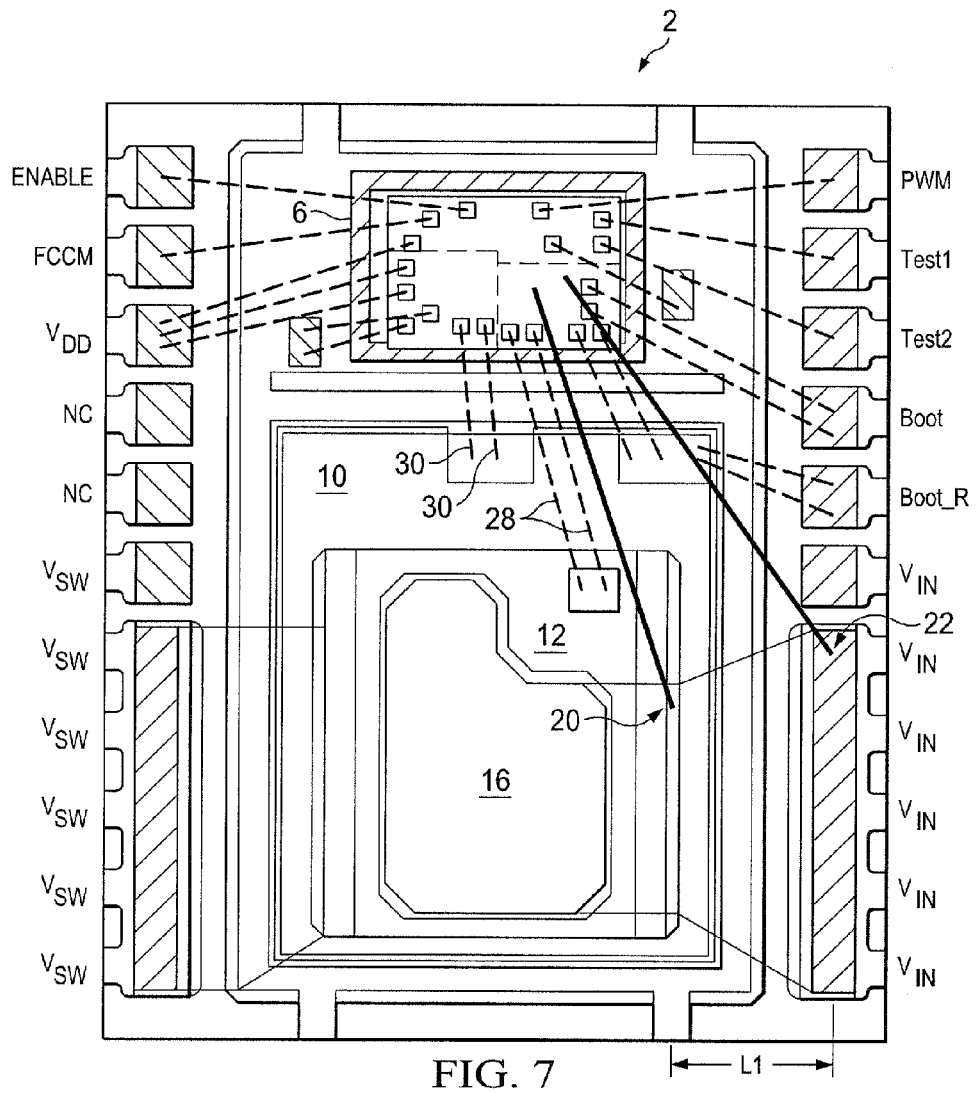
Figure 8:
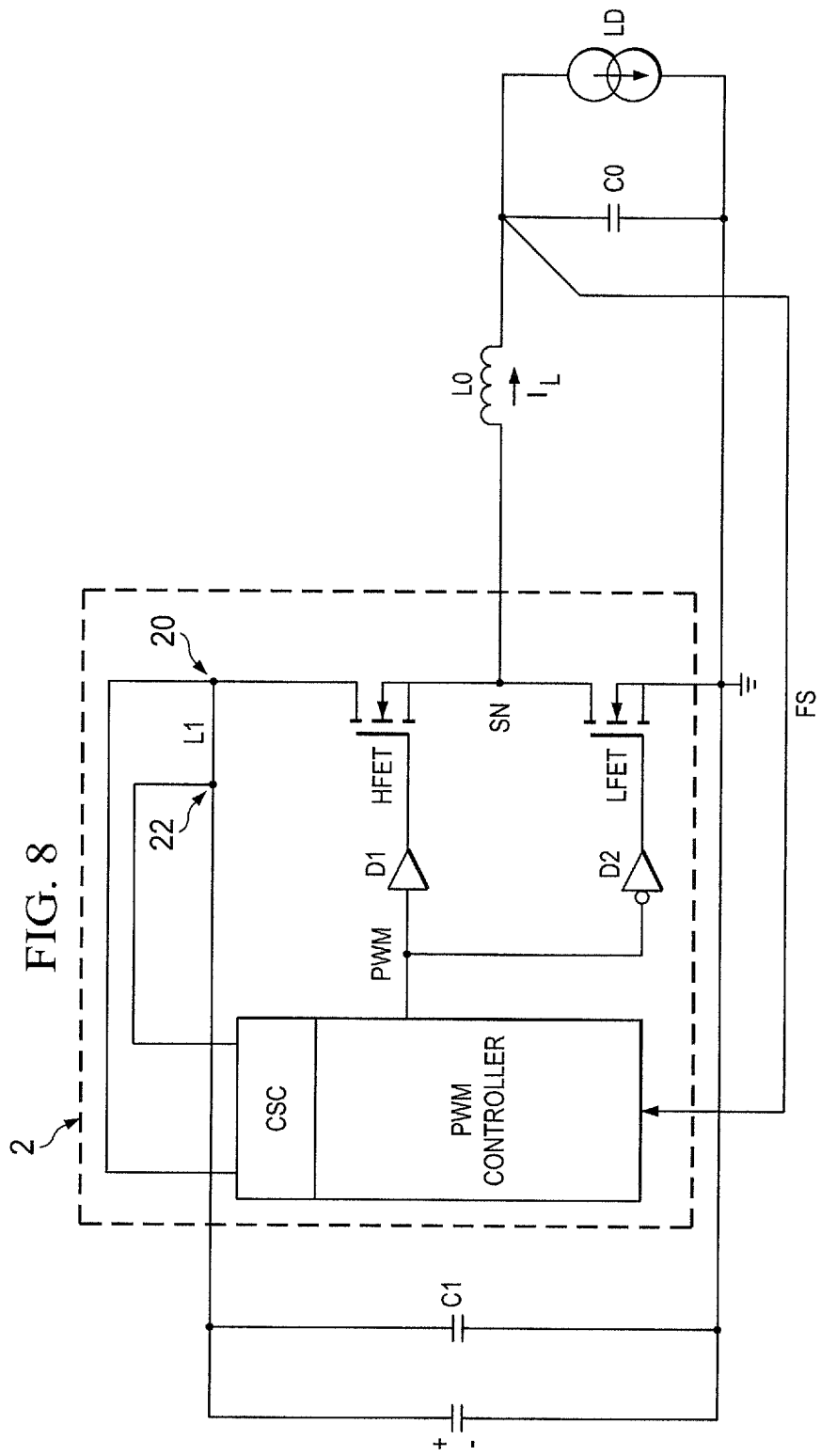

FIG. 7 is a simplified top view of the multi chip module 2 known from FIG. 5 and corresponds to FIG. 3. The top view is already explained by making reference to FIG. 3, despite the fact that the first and second checkpoint 20 and 22 for performing high-side current sensing are located on the high-side clip 16. The length of the predetermined portion 18 may be different, (i.e. according to the depicted embodiment L1).

FIG. 8 is a simplified circuit diagram for a DC/DC converter according to a further embodiment of the invention. The DC/DC converter comprises a multi chip module 2, according to the embodiment of FIGS. 5 to 7, allowing high-side current sensing. The circuit diagram is comparable to the one shown in FIG. 4. However, a voltage drop over a predetermined length L1 (see FIG. 7) between the first and second checkpoint 20 and 22 is measured by the current sensing circuit CSC at the high-side field effect transistor HFET.

Figure 9:
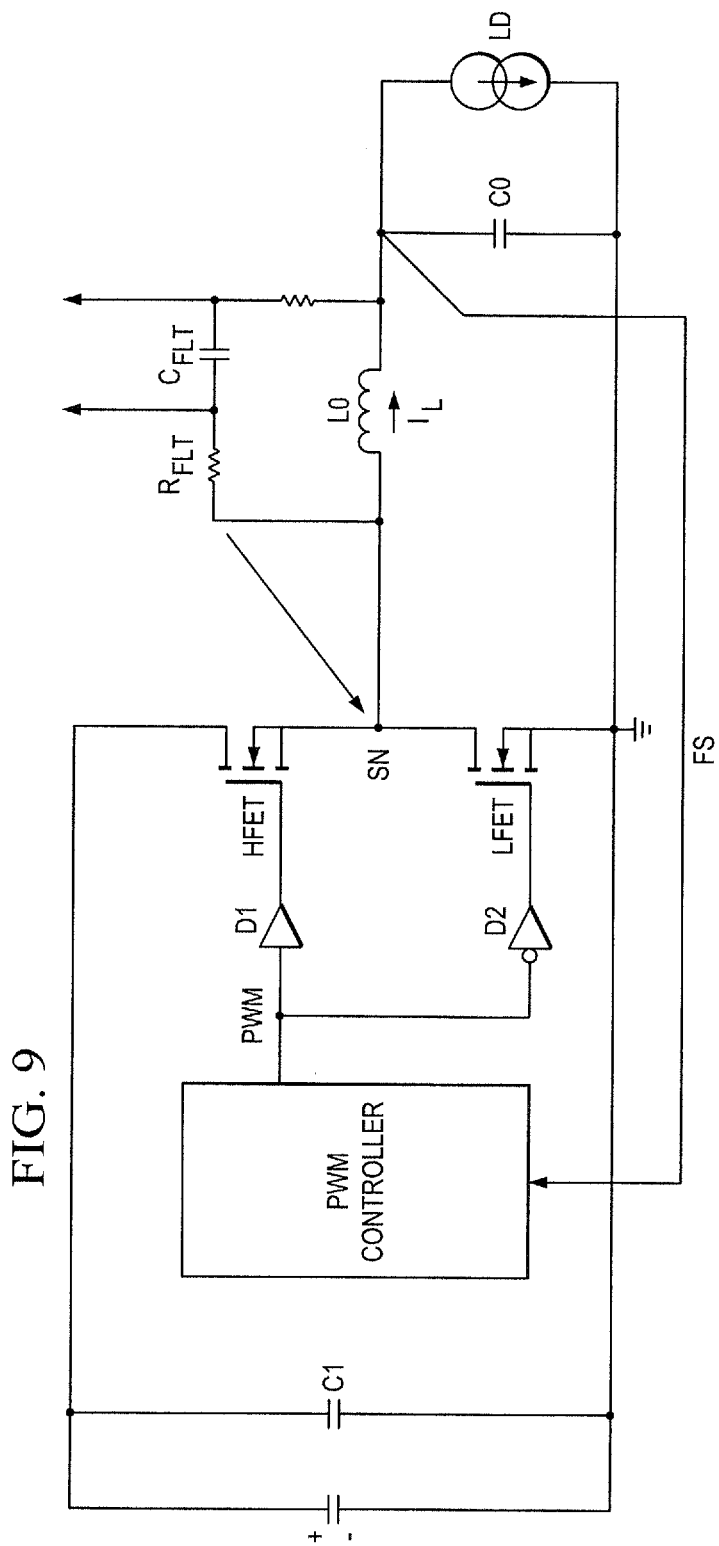
FIG. 9 is a simplified circuit diagram for a conventional DC/DC converter.

FIG. 9 is a conventional DC/DC converter. The current $I_L$ that is provided at the switching node SN to the inductance L0 is measured by a resistor $R_{FLT}$ and a capacitor $C_{FLT}$ that are coupled in series to the inductance L0 of the DC/DC converter comprising the inductance L0 and the capacitance C0. When comparing the DC/DC converter in FIG. 9 with the embodiments in the aforementioned FIGS. 1 to 8, it is clear that, according to the invention, current sensing in the inductance L0 may be performed without using a further circuitry.

Although the invention has been explained by exemplarily referring to a DC/DC converter, it is understood that other semiconductor half bridge configurations may be embodiments according to the invention, wherein current sensing at the switching node is provided.

Full or half bridge implementation (e.g., for a motor control or for providing a class D amplifier), may be realized using a multi chip module according to an embodiment of the invention. For a motor control half or full-bridge configuration, it may be even advantageous to make use of drain down field effect transistors, in order to connect the low-side field effect transistor drain to the lead frame. In comparison to the aforementioned embodiments, the field effect transistor dies 10, 12 will be integrated into the semiconductor half bridge configuration exactly the other way round, (i.e., drain down). Accordingly, the source of the low-side field effect transistor and the drain of the high-side field effect transistor would be coupled to the center tap clip 14 and the high-side field effect transistor would be coupled to the upper tap clip 16. This way, the upper tap clip would allow current sensing against ground. The lead frame would be coupled to a positive supply rail. This setup might be advantageous for a multi chip module where a half or full-bridge of one of the two above-mentioned setups would be used in a class D amplifier or in a contactless power transmission multi chip module setup.

Although the invention has been described in detail, it should be understood that various changes, substitutions and alterations can be made thereto without departing from the spirit and scope of the invention as defined by the appended claims.

The invention claimed is:

1. A multi chip module comprising:
    (a) an elongate substrate;
    (b) a lead frame having individual contact leads positioned on opposite sides of the substrate and including a group of first contact leads and a group of second contact leads;
    (c) a current sensing circuit die mounted on the substrate and having a first current sensing contact pad and a second current sensing contact pad;
    (d) a semiconductor half bridge configuration including:
        (i) a lower metal tap clip having a bottom surface mounted on the substrate and having a top surface;
        (ii) a lower field effect transistor having a bottom surface mounted on the top surface of the lower metal tap clip and having a top surface;
        (iii) a central metal tap clip having a bottom surface mounted on the top surface of the lower field effect transistor and having a top surface, the central metal tap clip having a contact portion extending over and contacting the first contact leads;
        (iv) an upper field effect transistor having a bottom surface mounted on the top surface of the central metal tap clip and having a top surface; and
        (v) a top metal tap clip having a bottom surface mounted on the top surface of the upper field effect transistor, a top surface, and having a contact portion extending over and contacting the second contact leads;
    (e) a first bond wire connected between the first current sensing contact ad and a first check point on the to surface of one of the central and top metal tap clips, the first check point being spaced away from the connecting portion of the one central and top metal tap clip; and
    (f) a second bond wire connected between the second current sensing contact pad and a second check point near the the connecting portion of the one central and top metal tap clip, the first and second check points being spaced apart to provide a metal resistance between the check points.

2. The multi chip module of claim 1, in which the first check point is on the central metal tap clip and is connected near to a switching node between a source of the upper field effect transistor and a drain of the lower field effect transistor, and the second check point is on the central metal tap clip and is spaced a distance L from the first check point away from the switching node.

3. The multi chip module of claim 1, in which the second contact leads are coupled to a drain of the upper field effect transistor, and in which the first check point is on the top metal tap clip and is connected near to the drain of the upper field effect transistor, and the second check point is on the top metal tap clip and is spaced a distance L from the first check point towards the second contact leads.

4. The multi chip module of claim 1, in which the current sensing circuit die includes gate drive contact pads coupled to gates of the upper and lower field effect transistors.

5. The multi chip module of claim 1, in which the tap clips are made of copper.

6. The multi chip module of claim 1, in which the metal tap clips are made of a manganin alloy consisting essentially of 86% copper, 12% manganese and 2% nickel.

7. The multi chip module of claim 6, in which the lead frame is made of a manganin alloy consisting essentially of 86% copper, 12% manganese and 2% nickel.

\* \* \* \* \*